United States Patent [19]

Allen et al.

[11] 4,145,660

[45] Mar. 20, 1979

[54] FREQUENCY ACTIVATED CIRCUIT

[75] Inventors: Richard W. Allen, Cherry Hill; Alexander Jackson, III, Moorestown, both of N.J.

[73] Assignee: RCA Corporation, New York, N.Y.

[21] Appl. No.: 863,906

[22] Filed: Dec. 23, 1977

[51] Int. Cl.$^2$ .............................................. H03K 9/06
[52] U.S. Cl. .................................... 328/138; 328/140; 328/153; 328/207; 329/107
[58] Field of Search ............... 328/138, 153, 140, 207; 329/107, 126; 307/233 R, 273

[56] References Cited

U.S. PATENT DOCUMENTS

| | | | |
|---|---|---|---|
| 3,638,038 | 1/1972 | Weber | 307/233 R |
| 3,769,596 | 10/1973 | Peersch | 328/138 |
| 3,943,382 | 3/1976 | Hermansdorfer et al. | 328/138 X |
| 3,958,183 | 5/1976 | Schaefer | 328/138 |
| 3,976,948 | 8/1976 | Dearden et al. | 328/138 |
| 4,002,990 | 1/1977 | Runey | 328/138 |
| 4,024,414 | 5/1977 | Gurry | 307/233 R |
| 4,097,812 | 6/1978 | Rzeszewski | 328/138 |

OTHER PUBLICATIONS

*Electronic Design* 8, Apr. 15, 1971, "Digital IC Tone Detector Responds Immediately to inputs" by Femling.
*Electronics*, Apr. 24, 1972, "One-Shot/Flip-Flop Pairs Detect Frequency Bands" by Pearson.

*Primary Examiner*—John S. Heyman
*Attorney, Agent, or Firm*—H. Christoffersen; Samuel Cohen; Carl M. Wright

[57] ABSTRACT

Frequency-activated channel selector having means to increase and to decrease the lower boundary frequency of a selected channel. When the channel selector couples an input signal to a particular channel, depending on the frequency of the input signal, the lower boundary for that channel is decreased to a lower value. When the frequency of the input signal drops to or below the lower value of the lower boundary, the lower boundary frequency is increased to a higher value. This hysteresis effect eliminates anomalous channel selection behavior when the input frequency is at the channel boundaries.

14 Claims, 2 Drawing Figures

FREQUENCY ACTIVATED CIRCUIT

The United States Government has rights in this invention in accordance with the terms of Contract No. DAAB07-76-C-0050, awarded by the Department of the Army.

This invention relates to channel selecting circuits which direct an input signal to a particular channel depending on the frequency.

In channel selecting circuits where an input signal is coupled to one of a plurality of output channels depending on the frequency of the input circuit, a common problem is the anomalous behavior of the channel selector when the input frequency is at or very near one of the boundaries of the frequency bands. Prior art solutions to this problem include providing guard bands between frequency bands or not allowing the boundary frequency to be an input frequency. These constraints require complex implementation or deny the use of part of the frequency range as input frequencies.

In a circuit embodying the invention for coupling an input signal to an output means depending on whether the frequency of the input signal has a period greater or less than a reference period, including means for receiving the input signal, includes frequency select means having a reference period control means responsive to the input signal for producing an enabling signal of one level when the period of the input signal is less than the reference period and of another level when the period of the input signal is more than the reference period. The circuit also includes coupling means responsive to the enabling signal for coupling the input signal to the output means and the improvement comprising a feedback means responsive to the enabling signal for supplying a signal to the reference period control means to change the reference frequency.

Figure 1:
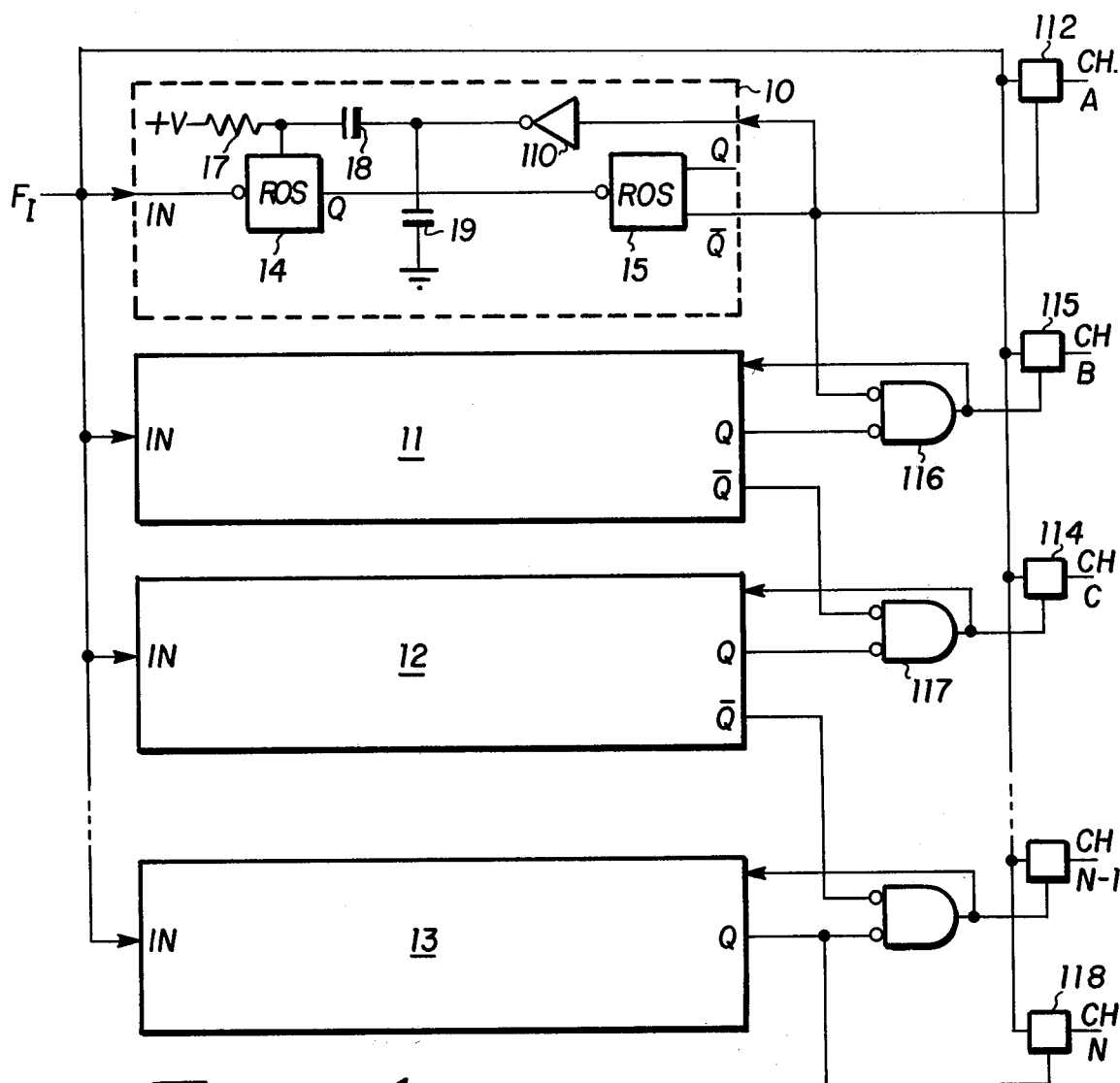
FIG. 1 is a block and logic diagram of a circuit embodying the invention.

The circuit shown in FIG. 1 utilizes a plurality of frequency selective devices 10-13. The frequency selective devices 11-13 are constructed in a way similar to that of device 10, which is shown in detail.

The details of the frequency select circuit 10 are now described in detail. The use of retriggerable one-shots to detect frequency bands is well known in the art. (See, for example, "One-Shot/Flip-Flop Pairs Detect Frequency Bands," E. E. Pearson, *Electronics*, Apr. 24, 1972, p. 104 and "Digital IC Tone Detector Response Immediately to Inputs," D. Fleming, *Electronic Design* 8, Apr. 15, 1971, p. 86. The following description is a summary of the circuit operation. Two retriggerable one-shots (monostable multivibrators) 14 and 15 are coupled in cascade. The period determining network for the one-shot 14, i.e., the resistor 17 and the capacitors 18 and 19, are shown outside the symbol for the one-shot. The period-determining network for the one-shot 15 is not shown separately because its period remains constant. The one-shot 15 must have a period longer than the period of the lowest input frequency, $F_I$. It must also be longer than the time required for the circuits to respond when incrementing the time period of the first one-shot 14. As shown in the Pearson reference cited above, the one-shot 15 can be replaced with a D-type flip-flop having the Q output signal of the one-shot 14 as the D-input signal and using the input signal as the clock input (CP) signal.

In the initial state, the output (Q) signal from the one-shot 14 is low, i.e., the one-shot 14 is in the reset, or stable state. Upon the application of a negative-going signal, the one-shot 14 is triggered into the set, or quasi-stable state and its Q output signal goes high. A retriggerable one-shot is one which remains in the set (quasi-stable) state for a period of time measured from the last input signal, i.e., every trigger signal restarts the timing.

An input signal at some frequency $F_I$ is coupled to the input terminal of the retriggerable one-shot 14. If the period of the input signal ($1/F_I$) is less than the time constant (period) of the retriggerable one-shot 14, the output signal from the one-shot 14 will remain high because it will be retriggered before the end of its set output state. The retriggerable one-shot 15, which in this example requires a negative-going edge as a trigger indicated by the input inversion circle, will not be triggered while the output signal from the retriggerable one-shot 14 remains high. In this case, the $\overline{Q}$ output signal remains high and is coupled to provide an input signal to an inverter 110, which can be implemented using an open-collector inverter or an inverting transmission gate.

When the $\overline{Q}$ signal to the inverter 110 is high, the inverter's output terminal provides a low impedance path to ground so that both sides of the capacitor 19 are grounded, removing it from the circuit. Consequently, the period, $T_a$, of the one-shot 14 is then determined by the capacitor 18 and the resistor 17. That is, $T_a \alpha RC_1$. When the $\overline{Q}$ signal goes low, the output impedance of the inverter 110 goes high, effectively that of an open circuit. With the output terminal of the inverter 110 at a high impedance, the capacitor 19 is effectively in series with the capacitor 18 so that the total capacitance of the time constant or period determining circuit for the one-shot 14 is reduced, decreasing the value $T_a$ to $T_a'$. That is, $T_a' \alpha RC_1C_2/(C_1+C_2)$. (Note: $C_1$ is capacitor 18, $C_2$, 19.)

The $\overline{Q}$ output signal is also coupled as the control signal to a transmission gate 112 which directs the input signal $F_I$ into the channel coupled to the output terminal of the transmission gate 112, i.e., CH.A. While the $\overline{Q}$ signal is high, the transmission gate 112 will pass the input signal $F_I$ to the corresponding channel, CH.A.

In the explanation which follows of the operation of the frequency select device 10, it is first assumed that the frequency of the input signal $F_I$ is less than $1/T_a'$. The period of the input signal, $1/F_I$, is, therefore, longer than the period of the one-shot 14 so that the output signal therefrom will go low repetitively, retriggering the one-shot 15 and causing the $\overline{Q}$ signal to remain low. As the frequency of the input signal increases, the amount by which the period of the triggering signals $F_I$ exceeds the period of the one-shot 14 decreases. When the frequency of $F_I$ reaches a value about equal to $1/T_a'$, the one-shot 14 continuously is retriggered before it can return to its reset state so that its output signal remains high. Thus, no negative-going signal is available to trigger the one-shot 15 and it returns to the reset state, causing the $\overline{Q}$ signal to go high and remain high. With the $\overline{Q}$ signal high, the period of the one shot 14 is increased to $1/T_a$, i.e., a lower frequency than $1/T_a'$.

Referring to $1/T_a'$ and $1/T_a$ as the upper and lower crossover frequencies, respectively, it is clear from the above description that when the input frequency exceeds the crossover frequency, the crossover frequency is at its lower value, and when the input frequency is less than the crossover frequency, the crossover frequency is at its upper value. Thus, the frequency select device 10 exhibits hysteresis so that hunting or anomalous behavior at the crossover frequencies are avoided.

The use of the circuit of the invention is especially advantageous when one of several channels is to be selected, depending on the frequency of the input signal. The other frequency selecting networks (frequency select devices) 11–13 shown in FIG. 1 are constructed the same as the frequency select device 10 except that the crossover frequencies are different. In general, a frequency select device is provided for every boundary frequency defining a plurality of channels. If the channels are adjacent, the upper boundary of one is the lower boundary of another channel. For example, if the crossover frequency of the frequency select device 11 is given by $f_b(=1/T_b)$, the transmission gate 115 will be activated, passing the input signal to channel B, while the input frequency is between $f_a(=1/T_a)$ and $f_b$. The input frequency, being greater than $f_b$, causes the Q output signal from the frequency select device 11 to be low and the $\overline{Q}$ signal to be high. Being below $f_a$, it causes the Q signal from the frequency select device 10 to be high and the $\overline{Q}$ signal to be low. The $\overline{Q}$ signal from the frequency select device 10 and the Q signal from the frequency select device 11, both being low, activate a negative input AND gate 116 which produces a high output signal which closes the transmission gate 115 and provides the frequency control feedback signal to the frequency select device 11. This causes the lower boundary frequency of channel B to decrease to $f_b'(=1/T_b')$, its lower value, in a manner as described above for the frequency select device 10. The upper boundary frequency, $f_a$, is increased to its upper value. As the frequency of the input signal decreases to that below $f_b'$, the Q signal from the frequency device 11 goes high and the $\overline{Q}$ signal goes low, inactivating the AND gate 116 and changing the value of the feedback signal into the device 11. This raises the crossover frequency from $f_b'$ to $f_b$. If the frequency is not decreased to a value less than $f_c'(=1/T_c')$, the lower crossover frequency of the frequency select device 12, then an AND gate 117 is activated in a manner similar to that described above and operates the transmission gate 114, coupling the input signal to channel C. The upper boundary frequency, $f_b'$, is raised to $f_b$ so that if the input frequency tends to dwell at the crossover frequency $f_b'$, the frequency select circuits will remain in a stable condition due to the shift in the crossover frequency of the frequency select device 11.

Each of the frequency select devices having a crossover frequency less than the input frequency remains activated. While activated, the crossover frequency is at the lower value. The AND gates such as the AND gates 116 and 117 select that channel which is bounded by the pair of adjacent frequency select devices that are in different states. When the input frequency decreases to a value below the lower boundary of the lowest frequency select device, i.e., in FIG. 1, frequency select device 13, the Q output signal can be used to select a channel as illustrated by coupling the Q signal from device 13 to the transmission gate 118, directing the input frequency to channel N.

Figure 2:
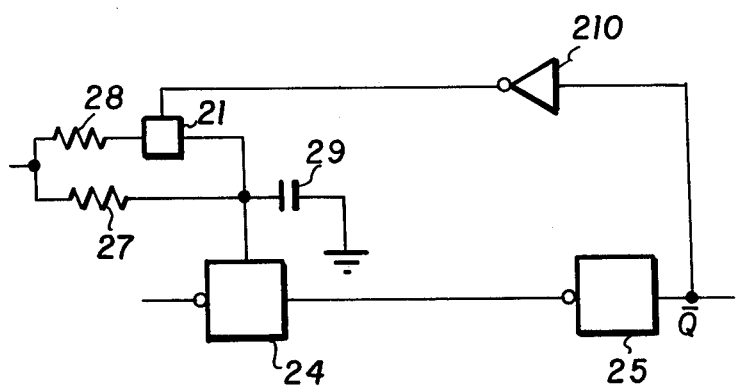
FIG. 2 is an illustration of an alternative circuit for varying the time constant of the input retriggerable one-shot of FIG. 1.

An alternative frequency control circuit is illustrated in the schematic of FIG. 2. The input one-shot 24 and the output one-shot 25 operate like the one-shots 14 and 15 in the circuit of FIG. 1. The inverter 210 need not be an open collector type like inverter 110. In this alternative circuit, when the $\overline{Q}$ signal is low, the output signal from the inverter 210 activates a transmission gate 21 which inserts a resistor 28 in parallel with a resistor 27. The combined value of the resistors in parallel is less than the value of resistor 27 alone. This combined value times the value of the capacitor 29 decreases the time constant for the one-shot 24. When the $\overline{Q}$ signal from the one-shot 25 is high, the output signal from the inverter 210 is low which opens the transmission gate 21 so that the time constant for the one-shot 24 is determined by resistor 27 alone in combination with the capacitor 29 (that is, the time constant increases). Thus, the crossover frequency of a frequency select device can be altered by changing either the resistive value or the capacitive value of the time determining network using a suitable feedback signal.

A circuit has been shown and described which selects an output channel for an input frequency depending on the input frequency, and which exhibits hysteresis to prevent hunting or anomalous behavior when the input frequency is at or near the crossover frequency. It has also been shown and described how the circuit can be used in a multi-channel frequency selecting circuit.

What is claimed is:

1. In a circuit for coupling an input signal to an output means depending on the frequency of the input signal, including means for receiving said input signal, frequency select means, including reference period control means, responsive to said input signal for producing an enabling signal of one level when the period of said input signal is less than a reference period and of another level when the period of said input signal is greater than said reference period, and coupling means responsive to said enabling signal for coupling said input signal to the output means, the improvement comprising:

feedback means responsive to said enabling signal for supplying a signal to said reference period control means to change said reference period.

2. The invention as claimed in claim 1, wherein said reference frequency control means includes time constant determining means and said frequency select means includes monostable multivibrator means.

3. The invention as claimed in claim 2, wherein said time constant determining means includes resistor means and capacitor means and said feedback means includes means for altering the value of said resistor means.

4. The invention as claimed in claim 2, wherein said time constant determining means includes resistor means and capacitor means and said feedback means includes means for altering the value of said capacitor means.

5. The invention as claimed in claim 4, wherein said capacitor means includes first and second capacitive means coupled in series between said resistor means and a reference node and wherein said feedback means includes means coupled to the junction of said first and second capacitive means for selectively coupling said junction to said reference node.

6. In a channel select circuit for coupling an input signal to one of a plurality of output means depending on the frequency of the input signal, including means for receiving said input signal, a plurality of frequency select means, responsive to said input signal for producing activating signals when the frequency of said input signal is greater than the boundary frequency, a plurality of gating means responsive to pairs of frequency select means for producing transmission signals when the activating signals of the frequency select means of said pair indicates said input signal is within a selected band of frequencies defined by the boundary frequencies of said pair of frequency select means, the improvement comprising:

feedback means responsive to said transmission signal for decreasing the lower boundary of said selected band.

7. The invention as claimed in claim 6, wherein said boundary frequency control means includes time constant determining means and said frequency select means includes monostable multivibrator means.

8. The invention as claimed in claim 7, wherein said time constant determining means includes resistor means and capacitor means and said feedback means includes means for altering the value of said resistor means.

9. The invention as claimed in claim 7, wherein said time constant determining means includes resistor means and capacitor means and said feedback means includes means for altering the value of said capacitor means.

10. The invention as claimed in claim 9, wherein said capacitor means includes first and second capacitive means coupled in series between said resistor means and a reference node and wherein said feedback means includes means coupled to the junction of said first and second capacitive means for selectively coupling said junction to said reference node.

11. The combination of:

a monostable circuit having an adjustable time constant circuit which determines the duration of the period $\Delta T$ that the circuit remains in its quasi-stable state, that is, the period between the time it is triggered and the time it returns to its stable state;

means for applying a triggering signal having a repetition period P, which may vary, to said monostable circuit, for switching said monostable circuit to its quasi-stable state, whereby when $P > \Delta T$, said monostable circuit is switched to its quasi-stable state in response to each trigger pulse and after the interval $\Delta T$ returns its stable state and when P becomes equal to $\Delta T$, said monostable circuit, after being switched to its quasi-stable state, remains in that state due to being retriggered before it can return to its stable state; and means responsive to the output of said monostable circuit when it remains in its quasi-stable state for an interval substantially greater than $\Delta T$, for adjusting said time constant circuit to increase the duration of the period $\Delta T$ to a new value $\Delta T'$ which is greater than $\Delta T$ and responsive to said triggering signal when its period P increases to a value greater than $\Delta T'$ for readjusting said time constant circuit to its original condition, for changing the duration of the period $\Delta T'$ back to the original value $\Delta T$.

12. The combination of claim 11, wherein said means responsive comprises a second multivibrator which is triggered by the output signal from said first multivibrator when the first multivibrator switches from its quasi-stable state to its stable state, said second multivibrator having a period $\Delta D > \Delta T$, whereby it is continuously retriggered and remains in its quasi-stable state so long as $P > \Delta T$, and it returns to its stable state $P < \Delta T$.

13. The combination of claim 12, wherein said time constant circuit includes resistance means in series with capacitance means, and wherein said means for adjusting the time constant circuit comprises means for changing the value of at least one of these two means.

14. A circuit for connecting an input terminal, to which an input signal whose frequency may vary is applied, to one of a plurality of channels, depending upon the frequency band in which the input signal is located, comprising, in combination:

a plurality of selector circuits, each controlling a different channel boundary, each selector circuit including means responsive to the input signal when its frequency is lower than a given value $f_j$ boundary frequency for producing an inhibit signal and responsive to the input signal when its frequency becomes about equal to $f_j$ for producing an enabling signal and for maintaining said activating signal as long as the input signal is in a frequency range greater than $f_k$, where $f_k$ is lower than $f_j$, for producing an inhibit signal only when the frequency of the input signal is less than $f_k$.

* * * * *

UNITED STATES PATENT AND TRADEMARK OFFICE
CERTIFICATE OF CORRECTION

PATENT NO. : 4,145,660

DATED : March 20, 1979

INVENTOR(S) : Richard W. Allen et al.

It is certified that error appears in the above-identified patent and that said Letters Patent is hereby corrected as shown below:

Column 6, line 22, "$P<\Delta T$" should be --$P \leq \Delta T$--.

Signed and Sealed this

Twelfth Day of June 1979

[SEAL]

Attest:

RUTH C. MASON
*Attesting Officer*

DONALD W. BANNER
*Commissioner of Patents and Trademarks*